United States Patent
Kitano

(10) Patent No.: US 6,620,251 B2
(45) Date of Patent: Sep. 16, 2003

(54) SUBSTRATE PROCESSING METHOD AND SUBSTRATE PROCESSING APPARATUS

(75) Inventor: Junichi Kitano, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 1 day.

(21) Appl. No.: 09/799,562

(22) Filed: Mar. 7, 2001

(65) Prior Publication Data

US 2001/0021486 A1 Sep. 13, 2001

(30) Foreign Application Priority Data

Mar. 8, 2000 (JP) .......................................... 2000-63192

(51) Int. Cl.[7] .......................... C23C 14/12; C23C 16/02
(52) U.S. Cl. .................... 118/725; 118/724; 118/50.1; 118/50; 118/63; 118/64; 134/902
(58) Field of Search ................................ 118/719, 728, 118/729, 320, 50.1, 724, 725, 62, 63, 64, 300, 323, 50; 134/902

(56) References Cited

U.S. PATENT DOCUMENTS

| | | | | |
|---|---|---|---|---|
| 4,924,800 A | * | 5/1990 | Tanaka | 118/50.1 |
| 5,700,127 A | * | 12/1997 | Harada et al. | 118/719 |
| 5,795,399 A | * | 8/1998 | Hasegawa et al. | 118/719 |
| 5,863,327 A | * | 1/1999 | Thakur | 118/50.1 |
| 5,863,338 A | * | 1/1999 | Yamada et al. | 118/320 |
| 6,127,262 A | * | 10/2000 | Huang et al. | 438/634 |
| 6,284,050 B1 | * | 9/2001 | Shi et al. | 118/715 |

* cited by examiner

*Primary Examiner*—Curtis Mayes
*Assistant Examiner*—George R. Koch, III
(74) *Attorney, Agent, or Firm*—Oblon, Spivak, McClelland, Maier & Neustadt, P.C.

(57) ABSTRACT

A closed container composed of a lid body and a lower container are provided in a cover body, and a supply pipe for nitrogen gas is connected to the cover body. A light source unit including UV lamps in the lid body is provided to face a mounting table in the closed container, and a gas supply path for HMDS gas is provided on the outer side from the light source unit. The inside of the cover body is first brought to a nitrogen atmosphere, a wafer is irradiated with ultraviolet rays with the lid body of the closed container opened to perform cleaning. Subsequently, the lid body is closed and the HMDS gas is introduced into the closed container to perform hydrophobic processing for the wafer. This removes deposits such as organic substances adhering to the wafer W through the irradiation with the ultraviolet rays, thereby improving coating properties of a resist solution.

7 Claims, 18 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus each for performing coating processing of, for example, a resist solution, developing processing, and the like for a substrate such as a semiconductor wafer, a glass substrate for a liquid crystal display, or the like.

2. Description of the Related Art

In the photolithography technology in processes of semiconductor device fabrication, a resist is applied to the front face of a semiconductor wafer (hereinafter, referred to as a "wafer"), the applied resist is subjected to exposure processing into a predetermined pattern and further to developing processing, thereby forming a resist film in the predetermined pattern. Such a series of processing is performed by a system in which an aligner is connected to a coating/developing apparatus.

FIG. 17 is a plan view showing an example of the above-described system, in which a cassette C housing therein substrates, for example, 25 wafers W is carried into a cassette stage 1 in a cassette station A1. A processing station A2 is connected to the cassette station A1, and further an aligner not shown is connected to the processing station A2 through an interface station A3.

A wafer W in the cassette station C on the cassette stage 1 is taken out by a transfer arm 11 and sent via a transfer unit of a shelf unit 12 to a coating unit 13, where a resist is applied thereto. Thereafter, the wafer W is transported via a wafer transporter MA, a transfer unit of a shelf unit 14, the interface station A3, to the aligner to be exposed to light. The wafer W after the exposure is transported via a reverse route to the processing station A2, and developed in a developing unit not shown provided at the tier under the coating unit 13, and thereafter the wafer W is transported via the wafer transporter MA, the transfer unit of the shelf unit 12 to the cassette C.

It should be noted that shelves of the shelf units 12 and 14 are configured as a heating unit, a cooling unit, a transfer unit for the wafer W, a hydrophobing unit and the like, so that heat processing and cooling processing are performed in this order in the shelf units 12 and 14 before the coating with the resist and before the developing processing for performance of the coating with the resist or the like at a predetermined temperature. Incidentally, numeral 15 denotes a transfer arm for transferring the wafer W between the processing station A2 and the aligner.

It is well known that organic substances adhere to the wafer W in a clean room atmosphere, the organic substances causing occurrence of flaking-off of the resist and coating particles, and thus there has been a great demand for removal of such organic substances. For the demand, it is more typical to clean the wafer W to thereby remove the organic substances, but the cleaning by a solution is often improper depending on the kind of films. Thus, the present inventor has developed a technique of removing the organic substances by irradiating the wafer W with an ultraviolet ray.

What is well known as the above-described UV cleaning apparatus is, for example, the configuration in which the wafer W on the mounting table is irradiated with the ultraviolet ray by a UV lamp for a predetermined period of time in a processing chamber of an atmosphere of natural air or an oxygen-rich atmosphere in a processing chamber. When this cleaning apparatus is installed into the aforesaid system, it is conceivable to dispose the apparatus, for example, in the shelf unit 12 or 14, and to transport the wafer W via the cassette C on the cassette stage 1, the transfer unit of the shelf unit 12, the cleaning apparatus, the hydrophobing unit, to the coating unit.

The cleaning apparatus, however, has a poor cleaning efficiency because of existence of gasses such as water vapor and oxygen which absorb the ultraviolet rays in the processing chamber, and thus it requires a period of cleaning, for example, 60 seconds to remove, to a predetermined amount or less, the organic substances adhering to the wafer W. Thus, the installation of the apparatus into the aforesaid coating and developing apparatus increases a period of time of the wafer W waiting for transport in the other units, whereby throughput is susceptible to deterioration. It is conceivable to increase the irradiation energy of the UV lamp in this event, but the power consumption also increases, presenting a problem in cost.

SUMMARY OF THE INVENTION

An object of the present invention is to provide a substrate processing method for removing deposits on a substrate in a short period of cleaning to improve coating properties of a resist solution and an apparatus therefor.

Thus, a substrate processing method of the present invention is characterized by comprising the steps of:

irradiating a front face of a substrate with a light from a light source to thereby remove a deposit on the front face of the substrate; subsequently, coating the front face of the substrate with a resist solution;

performing exposure processing for the substrate which has been coated with the resist solution; and performing developing processing for the substrate after the exposure to obtain a resist pattern, wherein the step of removing the deposit on the front face of the substrate is performed while a gas absorbing no light is being introduced into a light irradiation space between the light source and the substrate. In this event, the light irradiated onto the front face of the substrate comprises an ultraviolet ray, and the gas absorbing no light comprises an inert gas.

In the above-described method, the front face of the substrate is irradiated with light, so that the deposits such as organic substances adhering to the substrate, for example, in a clean room atmosphere can be removed, resulting in improved coating properties of the resist solution. In this event, the gas absorbing no light is introduced into the light irradiation space between the light source and the substrate, thereby improving irradiation efficiency of the light, shortening the period of cleaning, and preventing oxidation of the substrate.

It is suitable to perform the step of supplying a hydrophobic processing gas to the front face of the substrate to perform hydrophobic processing for the front face between the step of removing the deposit on the front face of the substrate and the step of coating the front face of the substrate with the resist solution, and in this case the quality of the front face of the substrate is improved by the irradiation with light, resulting in improved coating properties of the hydrophobic processing gas in the hydrophobic processing.

The above-described substrate processing method is carried out in a substrate processing apparatus comprising: a cleaning and hydrophobing unit including a cleaning unit, having a light source for irradiating a substrate with a light and a gas supplier for introducing gas absorbing no light into a light irradiation space between the light source and the substrate, for irradiating the front face of the substrate with the light from the light source to thereby remove a deposit on the front face of the substrate, and a hydrophobing unit for supplying a hydrophobic processing gas to the front face of the substrate to perform hydrophobic processing for the front face; a coater for coating the front face of the substrate with a resist solution; and a developer for performing developing processing for the substrate which has been coated with the resist solution and subjected to exposure processing to obtain a resist pattern.

For example, the unit including the cleaning unit and the hydrophobing unit here comprises: a processing container including a mounting table for holding the substrate; a light source for irradiating the substrate held on the mounting table with the light; a hydrophobic processing gas supplier for supplying the hydrophobic processing gas to the substrate held on the mounting table; and the gas supplier for introducing the gas absorbing no light into the light irradiation space between the light source and the substrate, wherein the front face of the substrate is irradiated with the light from the light source while the gas absorbing no light is being introduced into the irradiation space, and subsequently the hydrophobic processing gas is supplied to the front face of the substrate.

Further, a substrate transporter for transporting the substrate between the cleaning unit and the hydrophobing unit may be provided, and in the case where the cleaning unit and the hydrophobing unit are provided in the same processing chamber, the apparatus can be downsized.

Further the cleaning unit and the hydrophobing unit may be provided in different processing chambers, and a transporter may transport the substrate between the cleaning unit and the hydrophobing unit through an exclusive transport path.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, embodiments applied to a coating and developing apparatus for a substrate will be explained.

Figure 1:
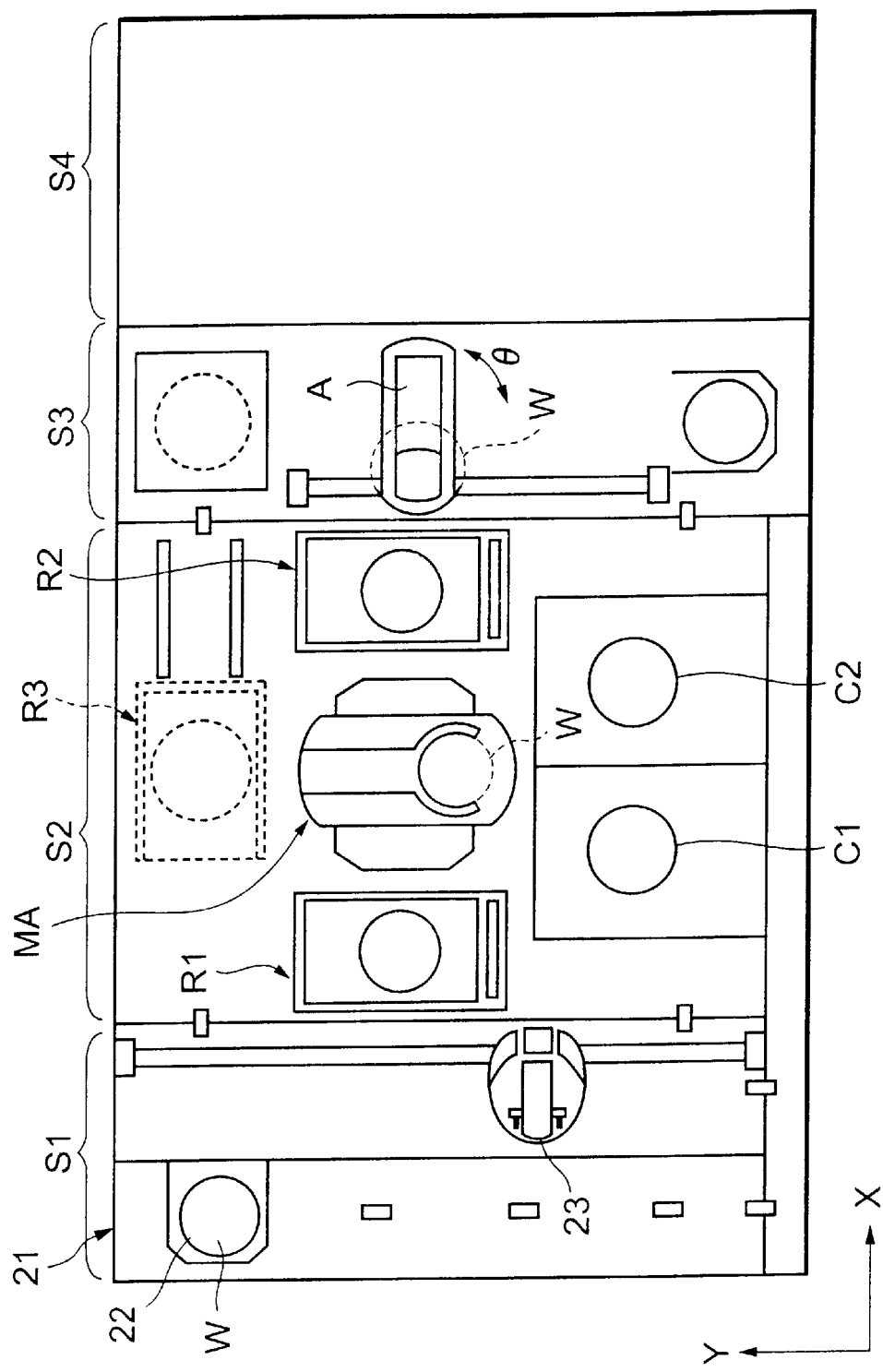
FIG. 1 is a schematic plan view showing a coating and developing apparatus according to an embodiment of the present invention.
Figure 2:
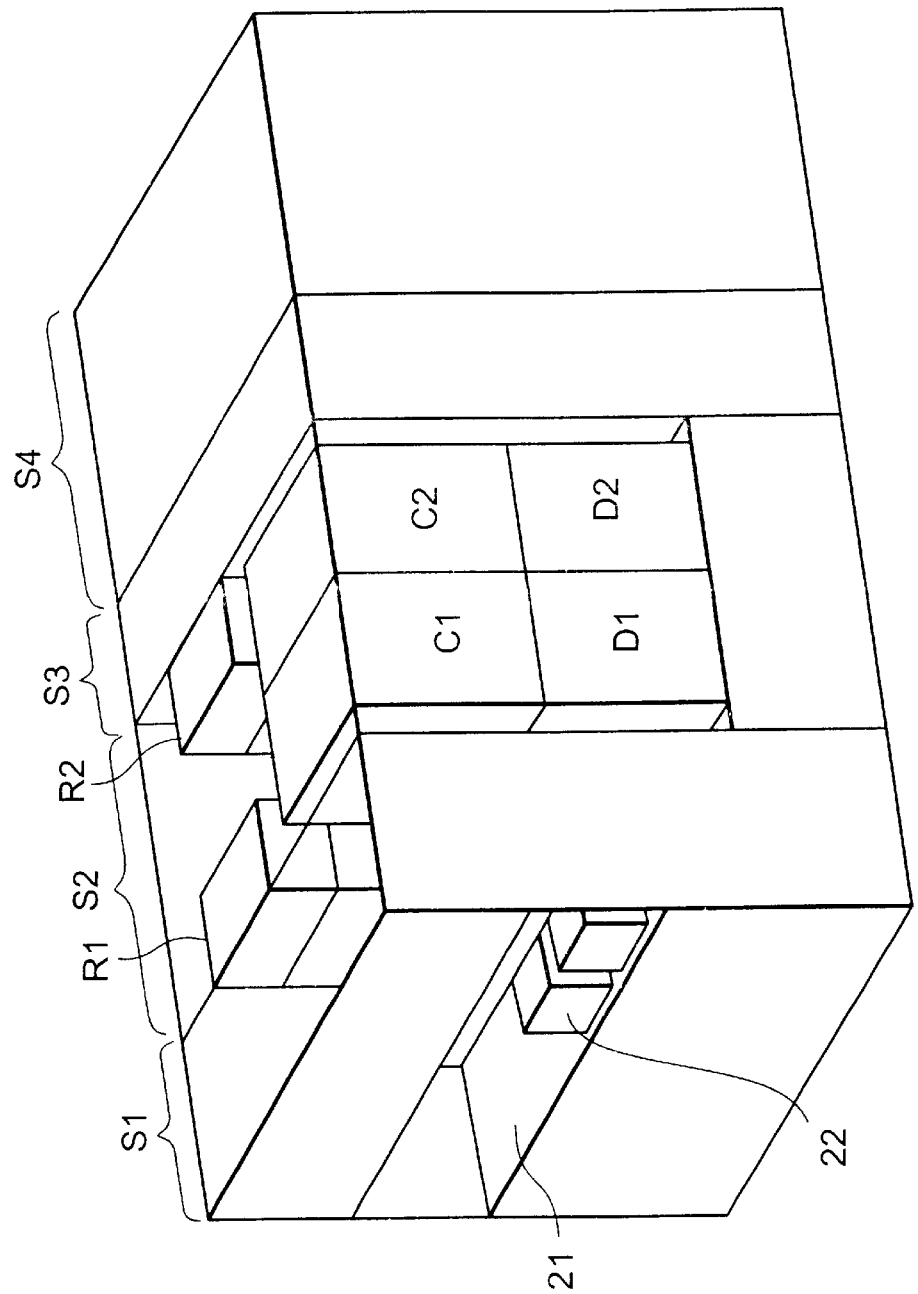
FIG. 2 is a schematic perspective view showing the coating and developing apparatus.

FIG. 1 is a schematic plan view of this embodiment, and FIG. 2 is a schematic perspective view revealing the inside thereof, in each of which S1 denotes a cassette station, S2 a processing station for performing coating processing of a resist and developing processing for a wafer W, S3 an interface station, and S4 an aligner.

The cassette station S1 comprises a cassette stage 21 for mounting thereon, for example, four wafer cassettes (hereinafter, referred to as "cassettes") 22, each housing a plurality of substrates, for example, 25 wafers W, and a transfer arm 23 for transferring the wafer W between the cassette 22 on the cassette stage 21 and the processing station S2. The transfer arm 23 is configured to be ascendable and descendable, movable in X- and Y-directions, and rotatable around the vertical axis.

The processing station S2, including, for example, two coating units C (C1 and C2) forming coating processing portions, two developing units D (D1 and D2) forming developing processing portions, for example, three shelf units R (R1, R2, and R3), and, for example, one substrate transporter MA, is configured to transfer the wafer W between the cassette station S1 and the interface station S3 and perform processing of cleaning the wafer W, processing of hydrophobing the front face of the wafer W, processing of coating the wafer W with a resist solution, developing processing of the wafer W, processing of heating the wafer W to a predetermined temperature before and after the above processings and cooling it in the station S2.

Explaining an example of the layout of the above-described processing station S2, on the back side of the aforesaid transfer arm 23, for example, processing units, including the coating units C and the developing units D and the like, are provided in two tiers, for example, on the right side as seen from, for example, the cassette station S1 toward the back. In other words, the two coating units C1 and C2 are disposed side by side in a direction almost orthogonal to the direction of arrangement of the cassettes on the cassette stage 21 with the coating unit C1 on the front side. At the tiers under the coating units C1 and C2, the two developing units D1 and D2 are disposed side by side with the developing unit D1 on the front side. Incidentally, the explanation hereafter will be given assuming that the cassette station S1 side is designated the front side and the aligner S4 side the back side.

On the left side of the processing units as seen from the cassette station S1, provided is the substrate transporter MA, which is, for example, ascendable and descendable, movable laterally and longitudinally, and rotatable around the vertical axis, for transferring the wafer W between the coating units C, the developing units D, and the shelf units R. The shelf unit R1, the shelf unit R2, and the shelf unit R3 are disposed on the front side, on the back side, on the left side of the substrate transporter MA respectively as seen from the cassette station S1 side. The shelf unit R3 and the substrate transporter MA, however, are omitted in FIG. 2 for convenience.

Figure 3:
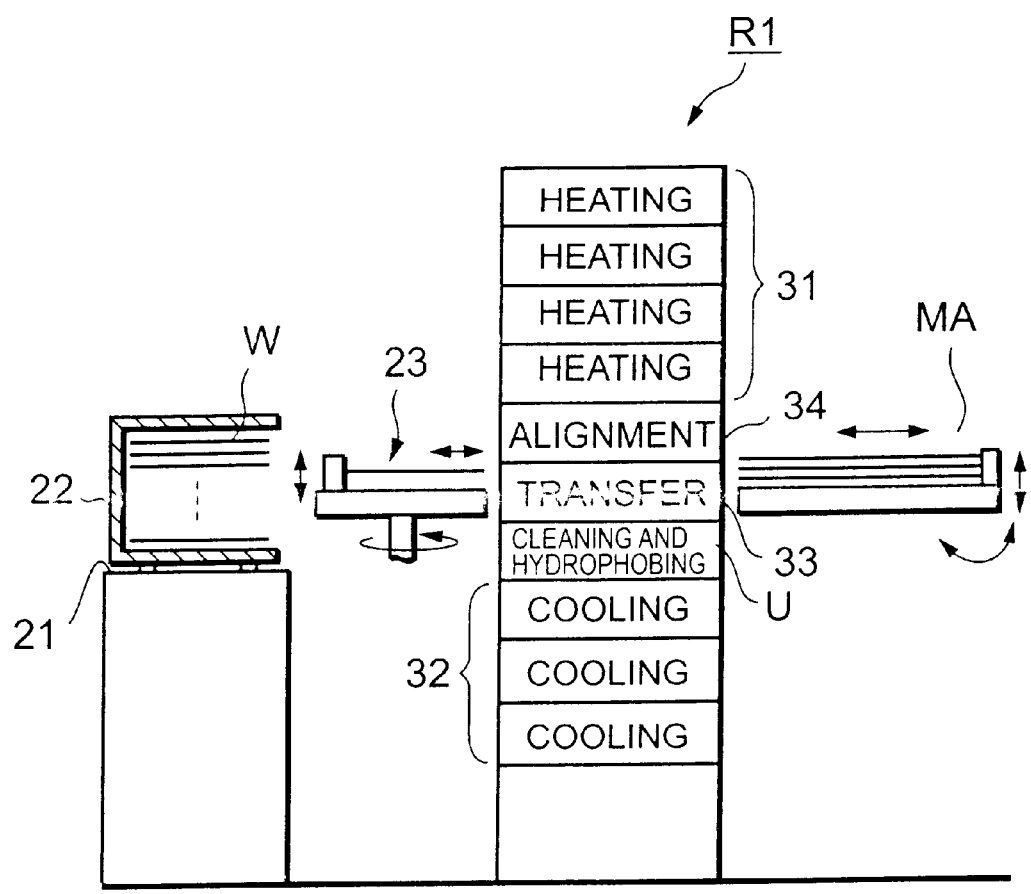
FIG. 3 is a side view showing an example of a shelf unit of the coating and developing apparatus.

In the aforesaid shelf units R (R1, R2, and R3), as in the shelf unit R1 shown in FIG. 3, heating units 31 for heating the wafer W, cooling units 32 for cooling the wafer W, cleaning and hydrophobing units U for cleaning and hydrophobing the front face of the wafer, transferring units 33 including transfer tables for transferring the wafer W between the transfer arm 23 of the cassette station S1 and the substrate transporter MA in the shelf unit R1, and for transferring the wafer W between a transfer arm A of the interface station S3 described later and the substrate transporter MA in the shelf unit R2, and an alignment unit 34 for aligning the wafer W in the shelf unit R1 are vertically arranged.

Figure 4:
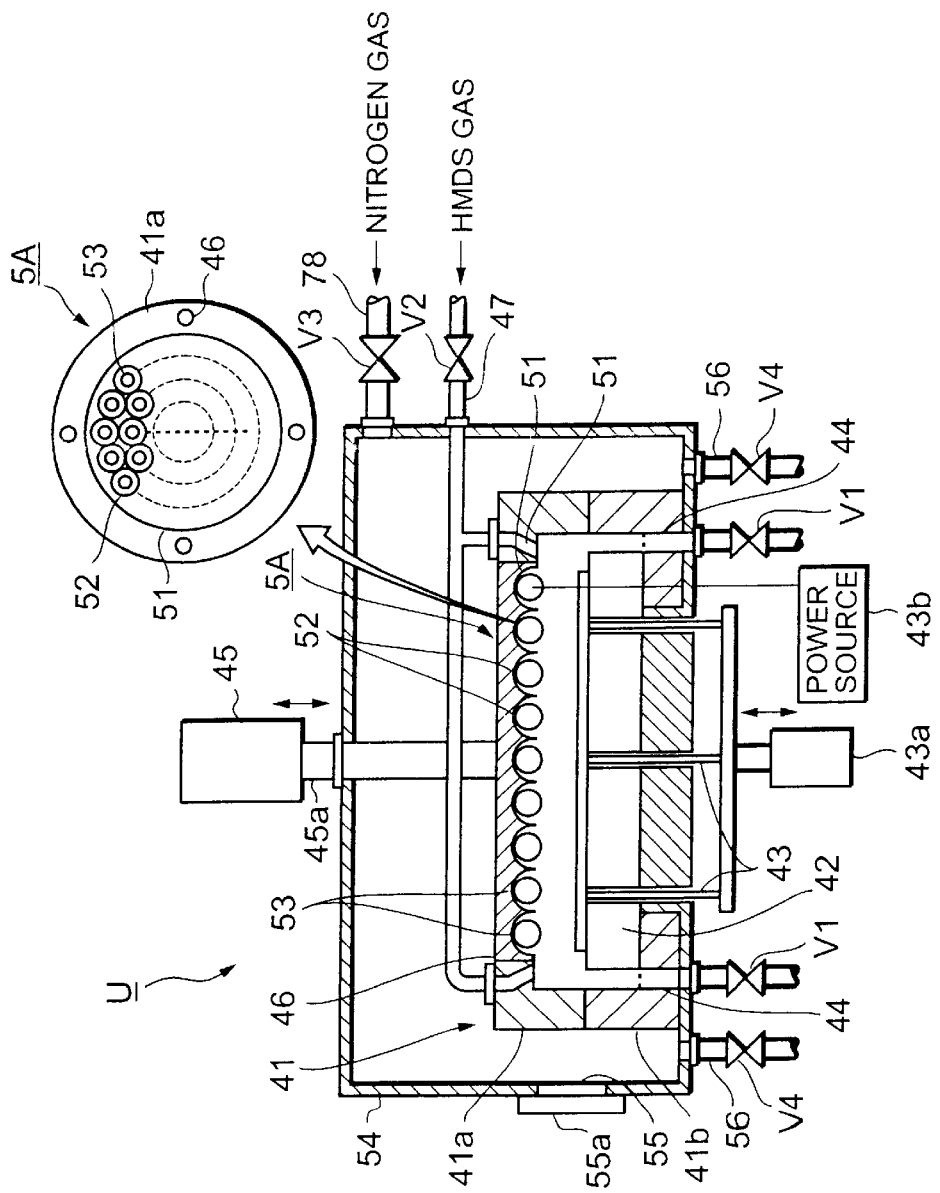
FIG. 4 is a sectional view showing an example of a cleaning and hydrophobing unit.

Explaining the aforesaid cleaning and hydrophobing unit U with reference to FIG. 4, numeral 41 denotes a closed container forming a processing container composed of a lid body 41a and a lower container 41b, and a mounting table 42 forming a mounting portion for the wafer W is provided in the lower container 41b. The mounting table 42 is provided with, for example, three ascending and descending pins 43 raised and lowered by a raising and lowering mechanism 43a to transfer the wafer W to the mounting table 42, and exhaust paths 44 including valves V1 are formed around the mounting table 42.

The aforesaid lid body 41a is configured to be ascendable and descendable by means of a raising and lowering mechanism 45 via a raising and lowering shaft 45a, and a light source unit 5A is provided almost at the center of the lid body 41a to face the mounting table 42. The light source unit 5A is formed to be larger than, for example, the wafer W, and includes, for example, light sources and a reflector 51. The light source irradiates the wafer W on the mounting table 42 with light such as an ultraviolet ray, and the reflector 51 is formed of a material, for example, an aluminum evaporation film or the like, which reflects the light irradiated from the light source. The reflector 51 is formed with almost semisphere shaped recessed portions 52 over its entire face, and, for example, excimer UV lamps 53 forming the aforesaid light sources are provided in the recessed portions 52, thereby constituting the light source unit 5A. The shape of the recessed portion 52 is made so that the light from the UV lamp 53 is reflected on an inner face of the recessed portion 52 to reach the wafer W on the mounting table 42, whereby the wafer W on the mounting table 42 is irradiated with the direct light from the UV lamp 53 and the light reflected on the reflector 51.

The light irradiated from the light source here refers to light with a short wavelength and high energy, for example, light with a wavelength ranging from 150 nm to 365 nm. A low-pressure mercury lamp, a noble gas short arc lamp, a microwave excitation Hg—Cd lamp, or the like, in addition to the excimer UV lamp, can be used as the light source. Further, an inert gas such as helium gas, argon gas, or the like, in addition to nitrogen gas, can be used as a gas which does not absorb light.

The lid body 41a is formed with four gas supply paths 46 forming a hydrophobic processing gas supply portion at a plurality of positions, for example, outside a region where the reflector 51 is formed, for example, positions created by equally dividing the periphery thereof into four, the gas supply path 46 composed of a flexible pipe and is connected to a not shown gas supply source through a gas supply pipe 47 provided with a valve V2. The gas supply paths 46 are formed to incline inward toward the lower side inside the lid body 41a, whereby the gas from the gas supply paths 46 reach the entire front face of the wafer W.

The aforesaid closed container 41 is covered with a cover body 54 forming a processing chamber, and the cover body 54 is formed with a wafer transport opening 55 which is opened and closed by a shutter 55a, and is connected to a gas supply pipe 78 forming a gas supply portion provided with a valve V3 for supplying into the cover body 54 the aforesaid gas, for example, nitrogen gas, which does not absorb the aforesaid light (ultraviolet ray), and exhaust pipes 56 provided with valves V4.

In the cleaning and hydrophobic processing unit U, a not shown controller performs the opening and closing operation of the shutter 55a, the raising and lowering operations of the raising and lowering mechanisms 43a and 45, the ON/OFF operation of a power source 43b of the UV lamps 53, and the opening and closing operations of the valves V1 to V4.

Figure 5:
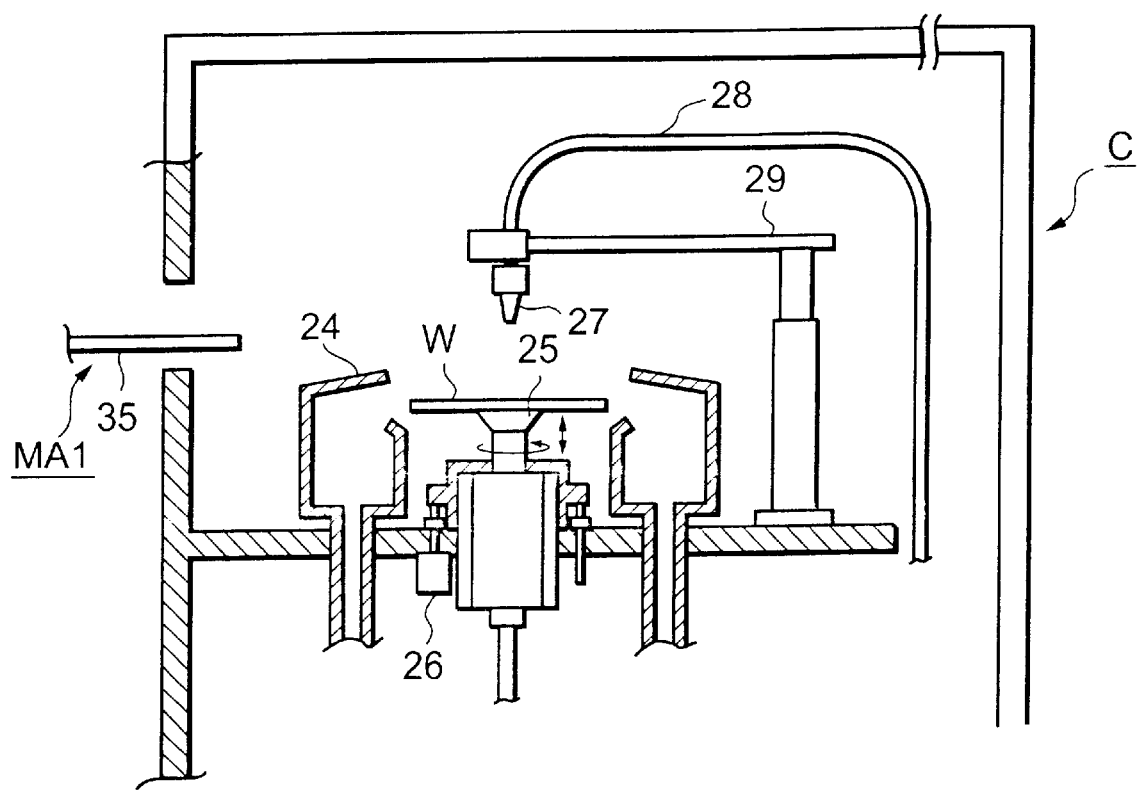
FIG. 5 is a sectional view showing an example of a coating unit.

Explaining the aforesaid coating unit C with reference to FIG. 5, numeral 24 denotes a cup, in which a rotatable spin chuck 25 having a vacuum suction function is provided. The spin chuck 25 is configured to be ascendable and descendable by means of a raising and lowering mechanism 26, and while it stays above the cup 24, the wafer W is transferred between the spin chuck 25 and an arm 35 described later of the aforesaid substrate transporter MA.

Numeral 27 denotes a discharge nozzle of a resist solution, numeral 28 a resist solution supply pipe, and numeral 29 a support arm for horizontally moving the nozzle. The discharge nozzle 27 is configured to supply the resist solution, for example, near the center the wafer W, so that the resist solution is dripped from the discharge nozzle 27 to the front face of the wafer W on the spin chuck 25 and the spin chuck 25 is rotated to thereby extend the resist solution over the wafer W for coating.

The developing unit D, having almost the same configuration as that of the coating unit C, in which a discharge nozzle 27 is configured to include many supply ports arranged in a direction of a diameter of the wafer W, and a developing solution is discharged from the discharge nozzle 27 to the front face of the wafer W on a spin chuck 25 and the spin chuck 25 is rotated a half turn, thereby applying the developing solution onto the wafer W, resulting in formation of a solution film of the developing solution.

Figure 6:
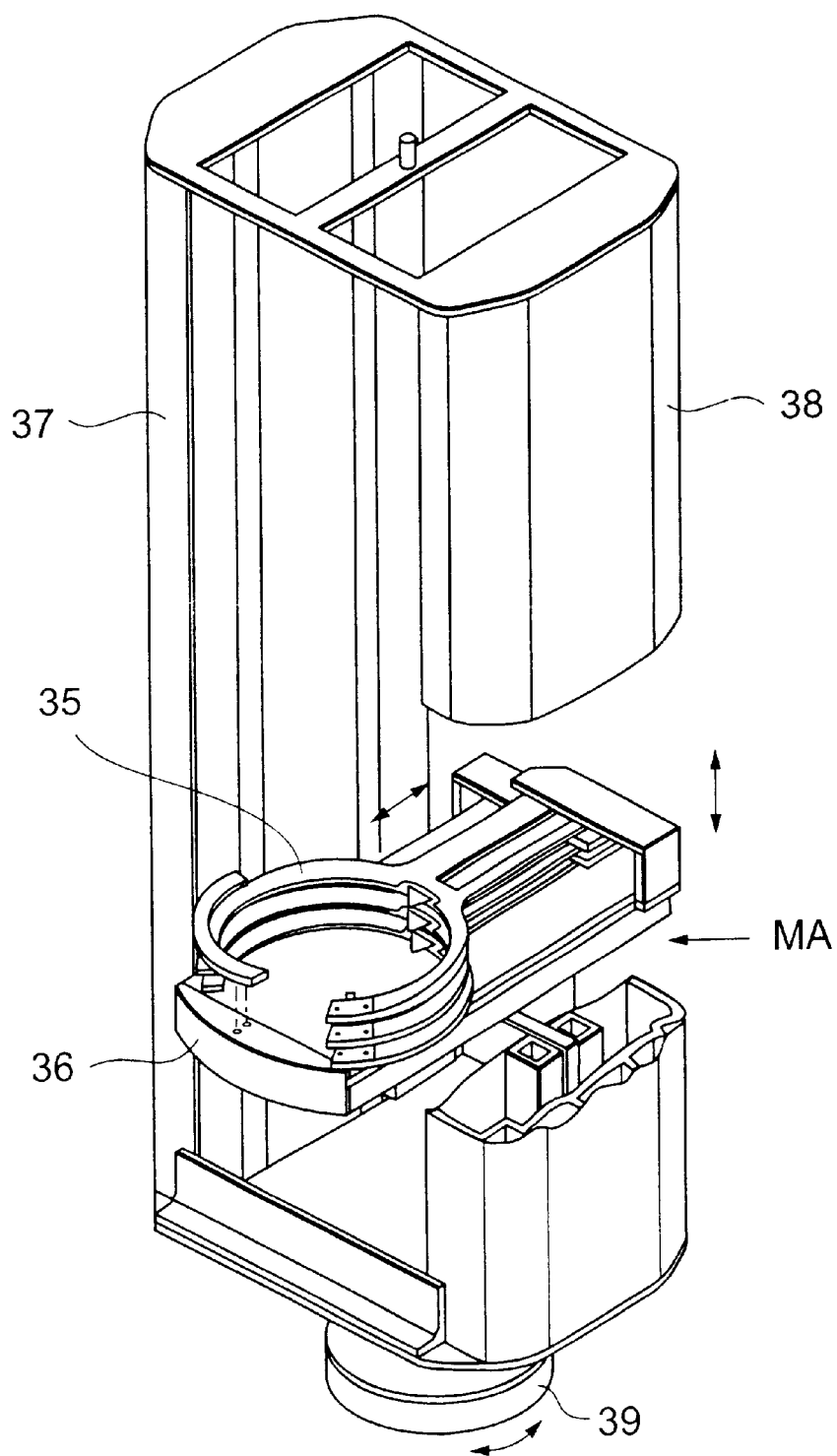
FIG. 6 is a sectional view showing a substrate transporter.

The aforesaid substrate transporter MA, as shown in FIG. 6, including, for example, three arms 35 for holding the wafer W, a base 36 for supporting the arms 35 and allowing them to be movable back and forth, and a pair of guide rails 37 and 38 for supporting the base 36 and for allowing them to be ascendable and descendable, is configured to be movable back and forth, to be ascendable and descendable, to be rotatable around the vertical axis by rotating the guide rails 37 and 38 by means of a rotation driver 39.

The interface station S3 is connected next to the processing station S2, and the aligner S4 forming an aligner portion for exposing the wafer W formed with a resist film to light is connected to the interface station S3 on the back side of the interface station S3. The interface station S3 includes the transport arm A for transferring the wafer W between the aforesaid shelf unit R2 in the processing station S2 and the aligner S4 so as to transfer the wafer W between the processing station S2 and the aligner S4.

Operations of the above-described embodiment will be explained next. The cassette 22 housing, for example, 25 wafers W is first carried into the cassette stage 21 by an automatic transport robot (or an operator), and the wafer W is taken out of the cassette 22 by the transfer arm 23 to be mounted on the transfer unit 33 of the shelf unit R1 in the processing station S2.

Figure 7A:
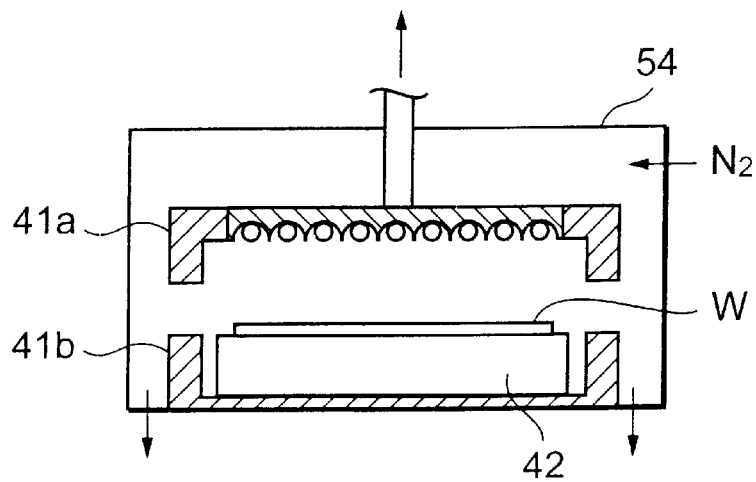
FIGS. 7A to 7C are sectional views for explaining operations of the cleaning and hydrophobing unit.

The wafer W is transported by the substrate transporter MA to the cleaning and hydrophobing unit U of the shelf unit R, where cleaning processing and hydrophobic processing for the front face of the wafer W are successively performed in this order. More concretely, as shown in FIG. 7A, the valves V3 and V4 are opened first to introduce nitrogen gas from the gas supply pipe 78 into the cover body 54 with an atmosphere in the cover body 54 being exhausted via the exhaust pipes 56. In this state, the shutter 55a of the cover body 54 is opened, and the lid body 41a of the closed container is raised, and then the substrate transporter MA carries in the wafer W through the wafer transport opening 55 and transfers it onto the mounting table 42 by combined operations thereof with the ascending and descending pins 43. After the substrate transporter MA is retracted, the shutter 55a is closed to exchange the atmosphere inside the cover body 54 for nitrogen gas.

Figure 7B:
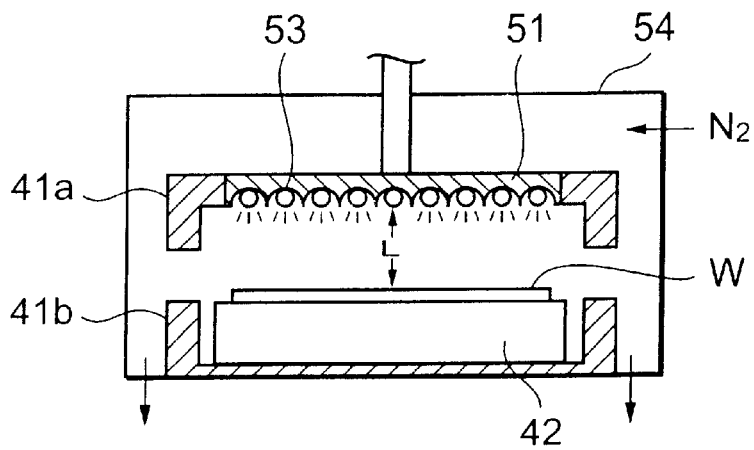

Then, as shown in FIG. 7B, the lid body 41a of the closed container is raised to adjust a distance L between the front face of the wafer W on the mounting table 42 and the lower end of the UV lamp 53 to a predetermined value. In the sate in which the inside of the closed container 41 has been brought to a nitrogen gas atmosphere as described above, the UV lamps 53 are turned on to irradiate the wafer W with ultraviolet rays with a wavelength of 172 nm for a predetermined period of time at a predetermined amount of irradiation electric power, thereby cleaning the wafer W.

As an example of cleaning conditions, the strength of the UV lamp 53 is 100 mW/cm2, the distance L between the UV lamp 53 and the wafer W is 2 mm, and the period of irradiation is 10 seconds, and, from an experimental example described later, it is preferable that the strength of the UV lamp 53 is 5 mW/cm2 to 120 mW/cm2, in this case the distance L between the UV lamp 53 and the wafer W being preferably 2 mm to 5 mm and the period of irradiation preferably 10 seconds to 30 seconds. The nitrogen gas atmosphere refers to an atmosphere having a nitrogen concentration higher than that of natural air, and the nitrogen concentration is preferably 90% or higher. Under the above-described conditions, the wafer W is irradiated with ultraviolet rays, whereby deposits such as organic substances on the front face of the wafer W are removed as described later.

Figure 7C:
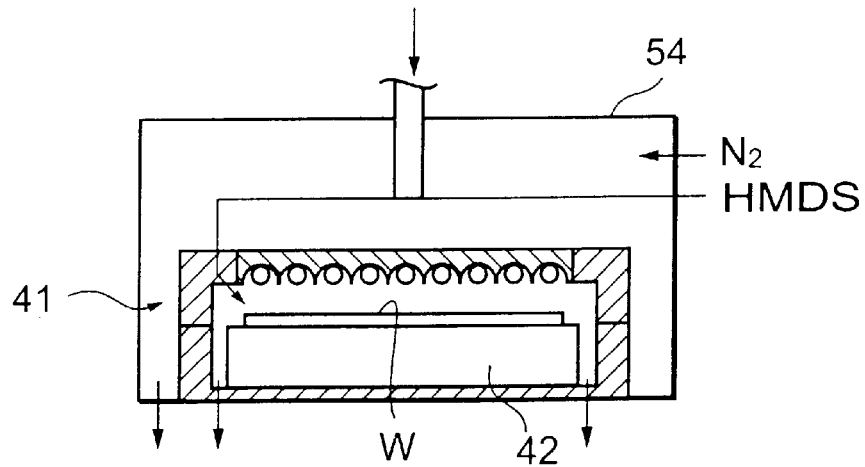

After the cleaning of the wafer W is performed as described above, as shown in FIG. 7C, the lid body 41a is lowered to close the closed container 41, and then the valves V1 and V2 are opened to supply a hydrophobic processing gas, for example, HMDS (hexamethyldisilazane) gas from the gas supply pipe 47 through the gas supply paths 46 into the closed container 41 with the atmosphere inside the closed container 41 being exhausted through the exhaust paths 44. The above-described contact between the front face of the wafer W and the HMDS gas enhances hydrophobic properties of the substrate. The enhancement of the hydrophobic properties is enhancement an interfacial angle of contact with water, thereby enhancing adhesion between the resist and the front face of the wafer W, and preventing the developing solution from entering a resist-wafer W interface during the development.

The hydrophobic processing is performed prior to coating with the resist solution to enhance adhesion between the wafer W and the resist to prevent a resist mask from flaking off the wafer W during a following developing step, and an ion-implanting step and an etching step to be performed thereafter.

Subsequently, the valve V2 is closed to stop the introduction of the HMDS gas, and the inside of the closed container 41 is sufficiently exhausted to prevent the HMDS gas from leaking outside because the HMDS gas has an amine group. Subsequently, the lid body 41a is raised to open the closed container 41 and the shutter 55a, and the wafer W is carried out through the wafer transport opening 55 by the substrate transporter MA. During a series of processing of the cleaning and the hydrophobic processing, the exhaustion and the introduction of nitrogen gas are being performed inside the cover body 54.

The wafer W is subsequently transported via the cooling unit 32 of the shelf unit R, the substrate transporter MA to the coating unit C, whereby the wafer W which has been subjected to temperature adjustment is coated with the resist solution at a predetermined temperature, for example, 23° C. Thereafter, the wafer W is transported via the substrate transporter MA, the heating unit 31 of the shelf unit R, the substrate transporter MA to the cooling unit 32 of the shelf unit R to thereby subjected to temperature adjustment, and subsequently, the wafer W is transported via the substrate transporter MA, the transfer unit 34 of the shelf unit R2, the transport arm A of the interface station S3 to the aligner S4 to be subjected to exposure.

The wafer W after the exposure is transported via the aligner S4, the transport arm A of the interface station S3, the transfer unit 33 of the shelf unit R2, the substrate transporter MA, the heating unit 31 of the shelf unit R, the cooling unit 32 to the developing unit D, whereby the wafer W is subjected to temperature adjustment by being first heated to a predetermined temperature and then cooled to a predetermined temperature, and is subjected to developing processing at a predetermined temperature, for example, 23° C. which is a coating temperature of the developing solution in the developing unit D.

The wafer W is thereafter transported via the substrate transporter MA, the heating unit 32 of the shelf unit R, the substrate transporter MA, the cooling unit 32 of the shelf unit R, the substrate transporter MA, the transfer unit 34 of the shelf unit R1 to the transfer arm 23, whereby the wafer W, which has been once heated to a predetermined temperature and then cooled to a predetermined temperature, is returned into, for example, the original cassette 22 through the transfer unit 33.

In the above-described embodiment, the wafer W is cleaned by being irradiated with ultraviolet rays prior to the coating with the resist solution, so that organic substances adhering to the wafer W, for example, in the clean room atmosphere can be removed.

Figure 8:
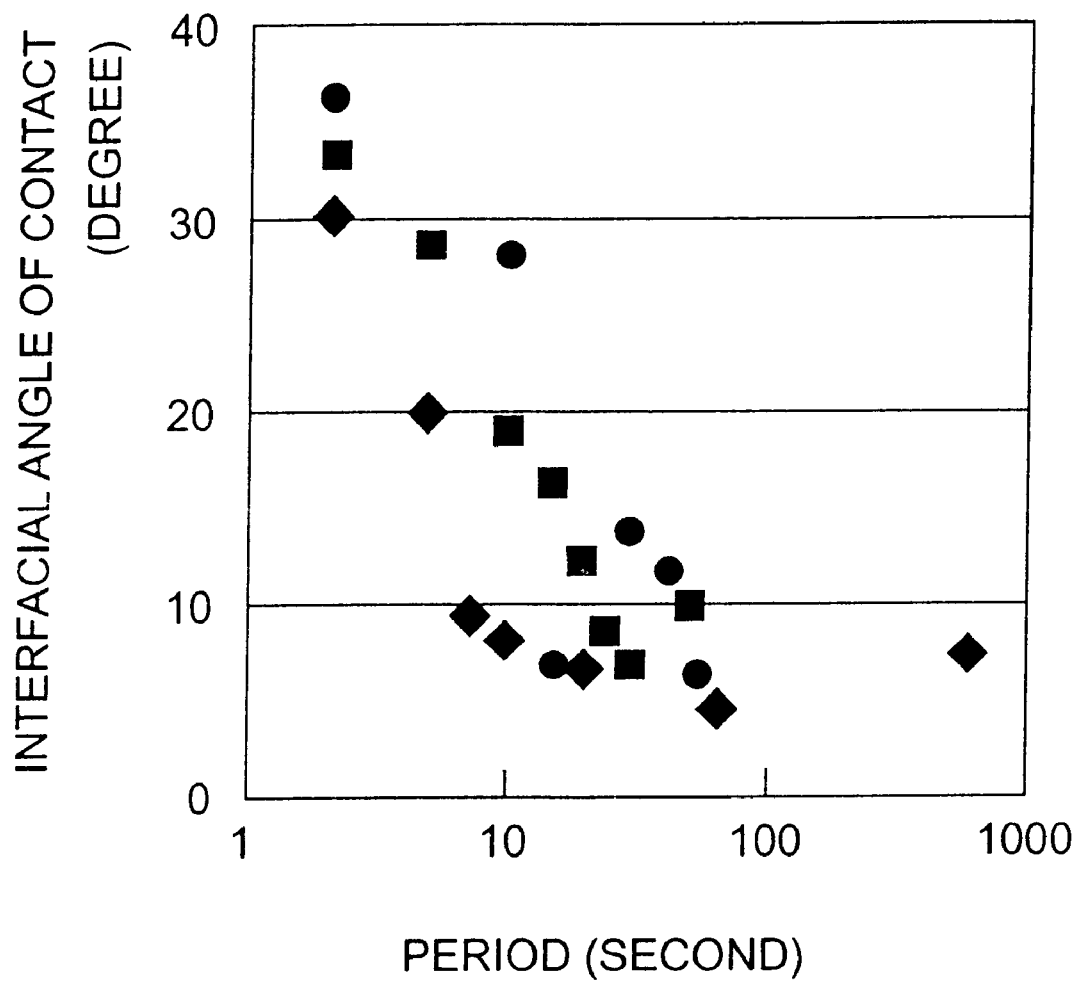
FIG. 8 is a characteristic chart showing effects of organic substance removal by ultraviolet ray irradiation.

FIG. 8 is a characteristic chart showing effects of organic substance removal by ultraviolet-ray irradiation to a thermal oxide film wafer contaminated by organic substances, and a horizontal axis and a vertical axis in the chart indicate the period of irradiation with ultraviolet rays and the interfacial angle of contact respectively. The interfacial angle of contact refers to an angle obtained by doubling the angle formed by a line which connects the crest of a waterdrop dripped on the front face of the substrate and the outer edge on the front face of the substrate with the front face of the substrate, and it is shown that the greater the interfacial angle of contact is, the greater is the amount of organic substances adhering to the substrate. The strength of the ultraviolet rays was about 100 mW/cm2, and the experiment was carried out changing the distance L between the substrate and the UV lamp 53 to 2 mm, 5 mm, and 10 mm. In the chart, marks ♦, ■, and ● indicate L=2 mm, L=5 mm, and L=10 mm respectively.

Figure 9:
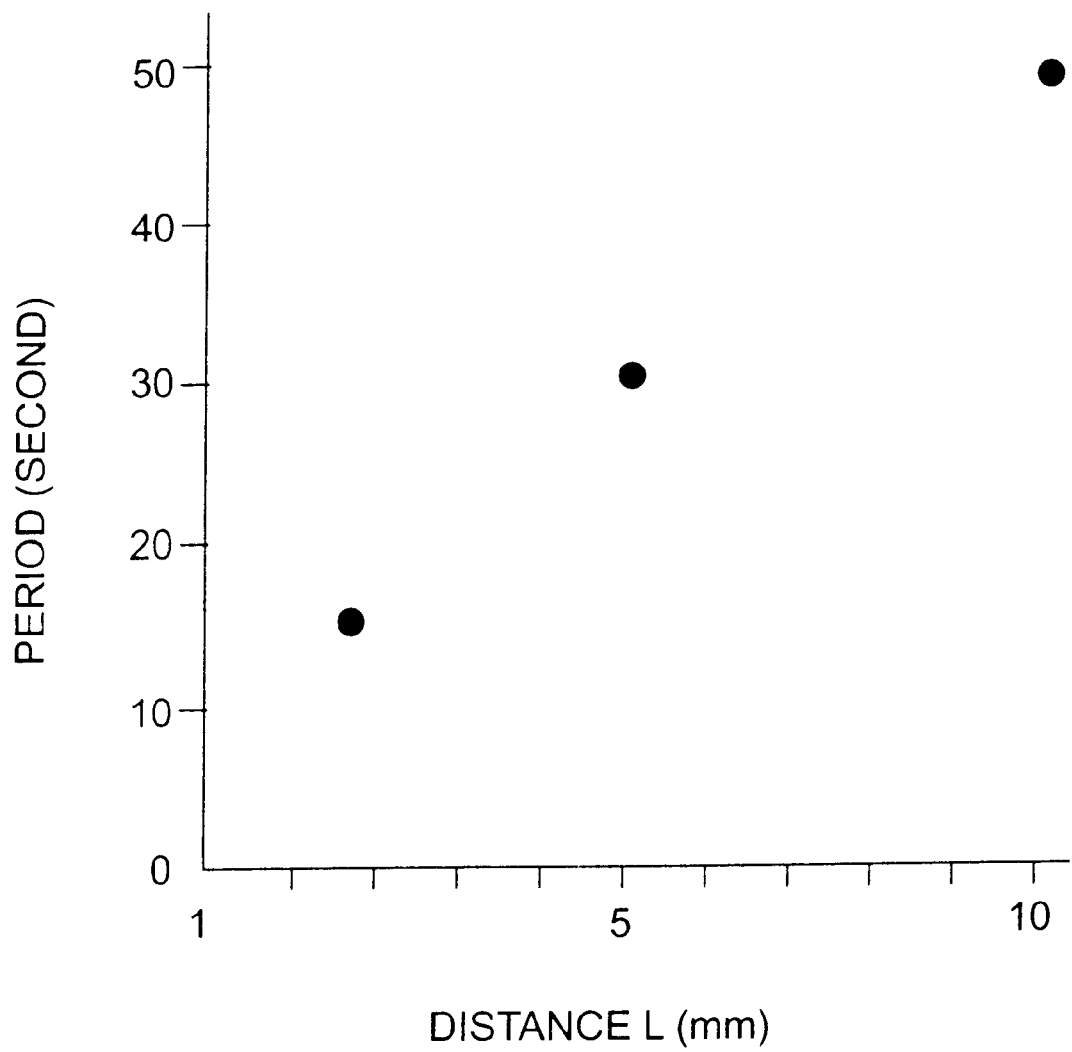
FIG. 9 is a characteristic chart showing a relation between a distance L between a wafer and a light source unit and performance of organic substances removal.

As is clear from this chart, regardless of the value of the distance L, the longer the period of irradiation of the substrate with ultraviolet rays is, the smaller the interfacial angle of contact becomes, and it has been shown that the amount of adherence of the organic substances decrease by the irradiation with ultraviolet rays. Further, the relation between the aforesaid distance L and the performance of organic substance removal was examined by measuring a period of time required for the interfacial angle of contact to be eight degrees, obtaining the result shown in FIG. 9, and it has been shown that the shorter the distance L is within its range from 2 mm to 10 mm, the shorter the period of time required for removal of organic substances is.

Since the organic substances adhering to the wafer W are removed by cleaning by the ultraviolet rays as described above, coating properties of the resist solution improve, and further the front face of the wafer W is improved in quality by the irradiation with the ultraviolet rays to thereby decrease in surface tension, resulting in enhanced coating properties of the HMDS gas in the hydrophobic processing.

In the cleaning and hydrophobing unit U, for example, nitrogen gas which does not absorb the ultraviolet rays is introduced into an irradiation region between the wafer W and the UV lamps during the irradiation with the ultraviolet rays to bring the region to a nitrogen gas atmosphere, so that the concentration of gas, for example, water vapor or oxygen, which absorbs the ultraviolet rays within the region, decreases, resulting in enhanced irradiation efficiency of the ultraviolet rays. This can shorten the period of time required for the cleaning processing, thereby suppressing deterioration of throughput in the above-described coating and developing apparatus.

The nitrogen gas is introduced here to prevent light with a wavelength 200 nm or shorter from being absorbed by oxygen or water so as to enhance the irradiation efficiency, and further an effect of inhibiting oxidation of the wafer W can also be obtained.

Figure 10A:
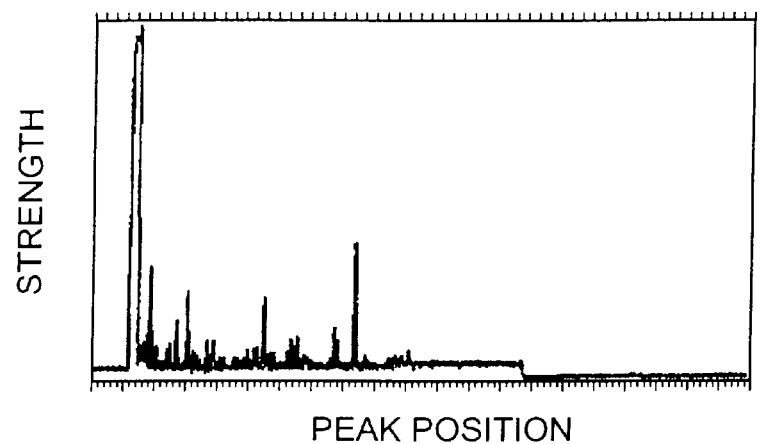
FIGS. 10A to 10C are characteristic charts of effects of organic substance removal by ultraviolet ray irradiation under a nitrogen atmosphere.
Figure 10B:
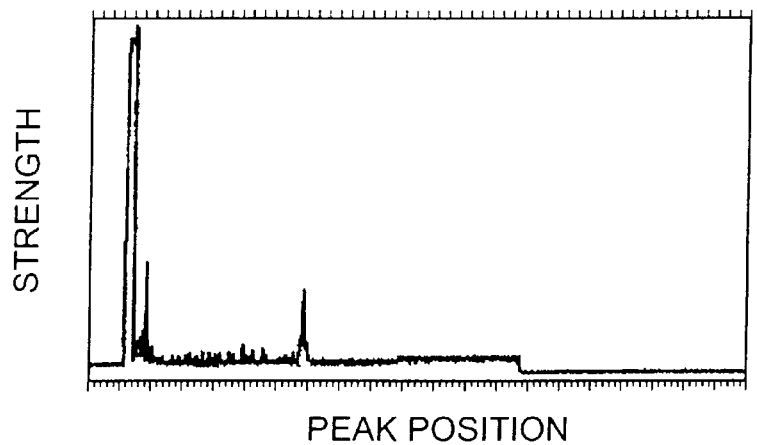
Figure 10C:
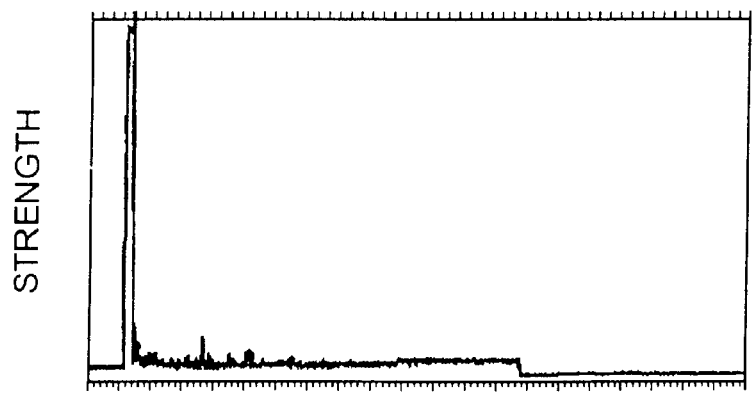

FIGS. 10A, 10B, and 10C are mass analysis spectra obtained by a gas chromatograph/mass spectrograph to check the effect of organic substance removal by the ultraviolet ray irradiation in the nitrogen atmosphere. FIG. 10A shows a spectrum of the wafer W left standing in a clean room, FIG. 10B a spectrum when the wafer W is laid in an oxygen atmosphere (oxygen concentration of 95% or higher) and irradiated with ultraviolet rays, and FIG. 10C a spectrum when the wafer W is laid in a nitrogen atmosphere (nitrogen concentration of 99% or higher) and irradiated with ultraviolet rays, respectively. In this event, the strength of the ultraviolet rays was 100 mW/cm2, the period of irradiation was 10 seconds, the distance L between the substrate and the UV lamp 53 was 2 mm.

In the spectrum, the position and the magnitude of a peak show the kind of organic substance and the amount of adherence of the organic substances respectively, and it is shown that the larger the number of peaks is and the greater the magnitude of the peak is, the greater is the amount of adherence of the organic substances. As is clear from the charts, however, it has been shown that the number of peaks is smallest and the magnitude of the peak is smallest in the case of irradiation with the ultraviolet rays in the nitrogen atmosphere. This provides an understanding of the fact that the irradiation efficiency of the ultraviolet ray is high in the nitrogen atmosphere, and thus the efficiency of cleaning of the organic substances is high.

From a viewpoint of introduction of nitrogen gas, the cleaning unit and the hydrophobing unit can be united in the same unit as in the above-described embodiment, thereby downsizing the apparatus in this case compared with the case in which the cleaning unit and the hydrophobing unit are separately provided. Further, the transport of the wafer W between the cleaning unit and the hydrophobing unit becomes unnecessary, thereby omitting the transporting step to improve the throughput further, and, more than that, preventing occurrence of re-adherence of the organic substances during the transport of the wafer W from the cleaning unit to the hydrophobing unit, so that the hydrophobic processing can be performed with the cleanliness of the wafer W being maintained.

Further, in the above-described embodiment, since the reflector 51 is provided on the opposite side to the side facing the wafer W of the UV lamps 53, the light scattering from the UV lamps 53 is reflected by the reflector 51 to reach the wafer W, thereby further improving the irradiation efficiency of the ultraviolet rays, resulting in a shorter period of cleaning time.

Figure 11:
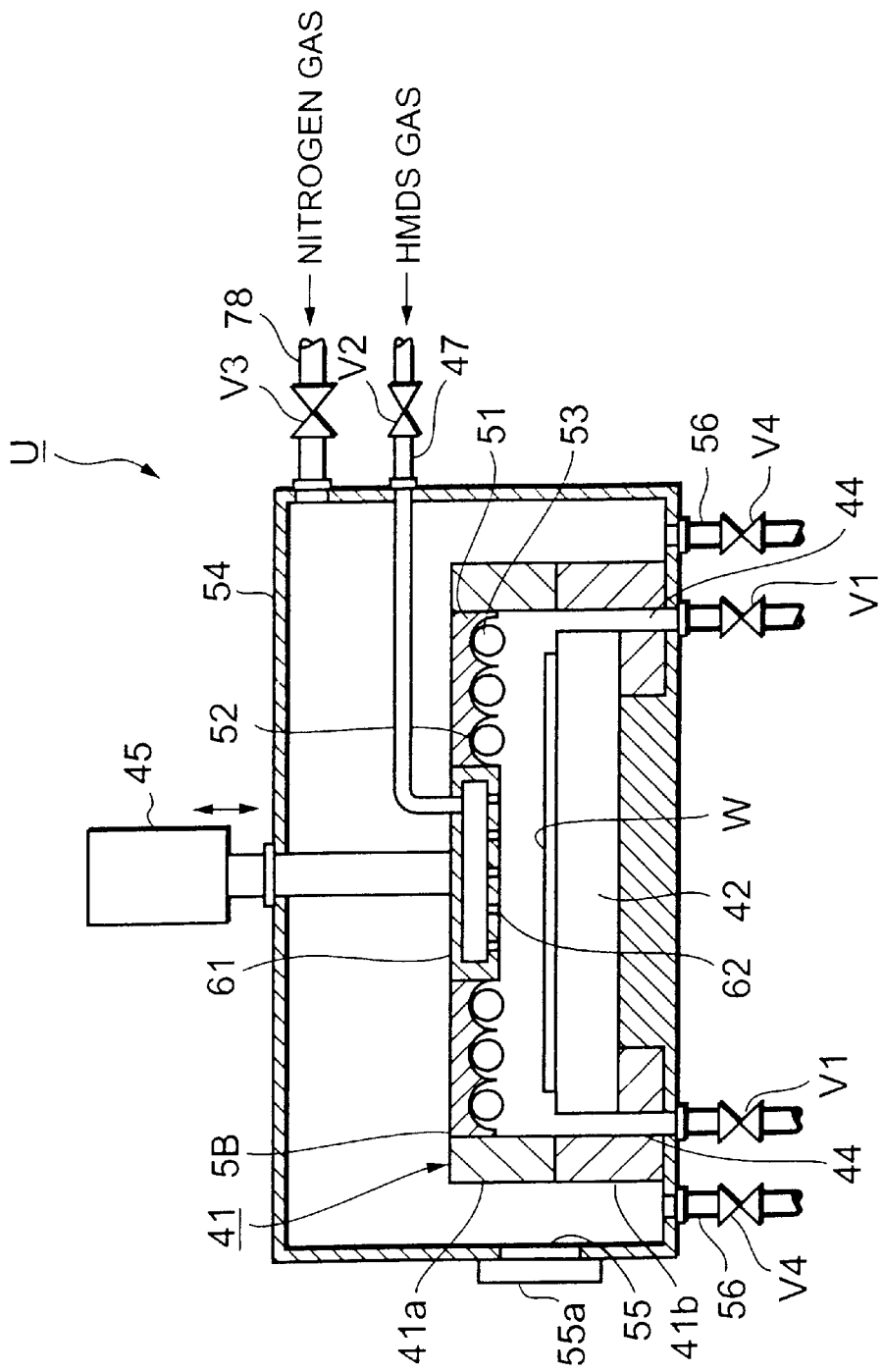
FIG. 11 is a sectional view showing another embodiment of the cleaning and hydrophobing unit.

In this embodiment in the above, the cleaning and hydrophobing unit U may be configured as that, for example, shown in FIG. 11 or in FIG. 12. An example shown in FIG. 11 is the one in which a gas supply chamber 61 forming the hydrophobic processing gas supply potion and a light source unit 5B are provided in combination with the lid body 41a. In this example, the gas supply chamber 61 is provided almost at the center of the lid body 41a, and the light source unit 5B is provided, for example, annularly outside the gas supply chamber 61. The light source unit 5B, other than its annular formation, is configured the same as for the light source unit 5A in the aforesaid embodiment, in which the gas supply chamber 61 includes many gas supply ports 62 at the lower face and is connected to a not shown gas supply source through a gas supply pipe 47 constituted of a flexible pipe.

In this embodiment, the UV lamps 53 of the light source unit 5B are turned ON first to perform cleaning processing for the wafer W, and thereafter HMDS gas is supplied to the wafer W through the gas supply chamber 61 to perform hydrophobic processing. In the above-described configuration, the HMDS gas is supplied to the wafer W from the gas supply chamber 61 provided almost at the center of the lid body 41a, so that the HMDS gas evenly contacts the front face of the wafer W to enhance the uniformity in the hydrophobic processing. Moreover, a condensing member (not shown), for example, a lens or the like may be provided to irradiate the center of the wafer W with the ultraviolet rays in this embodiment, in which the uniformity in the cleaning processing also improves.

Figure 12A:
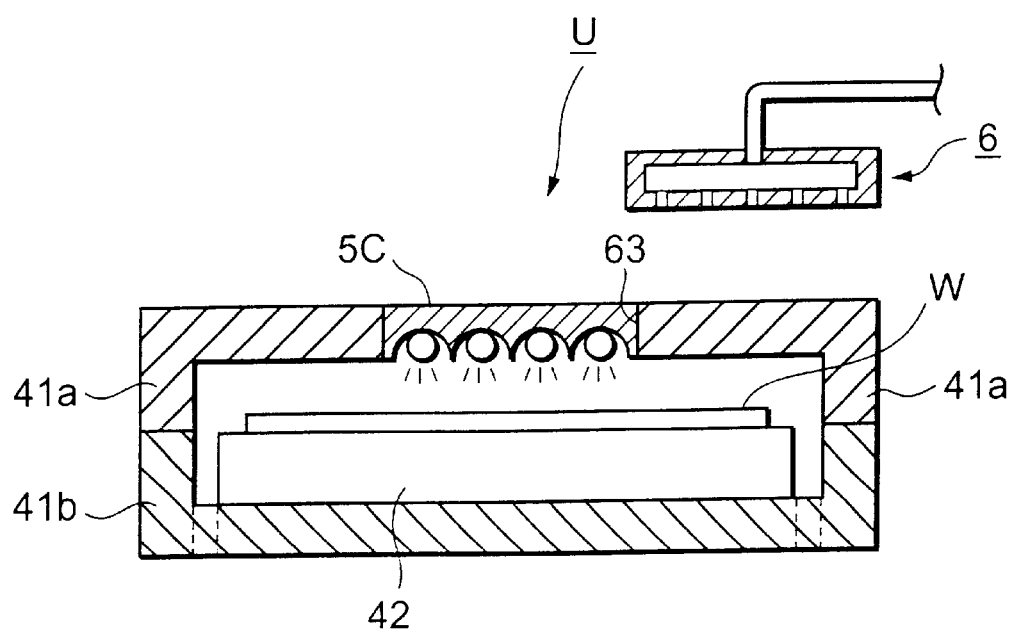
FIGS. 12A and 12B are sectional views showing still another embodiment of the cleaning and hydrophobing unit.
Figure 12B:
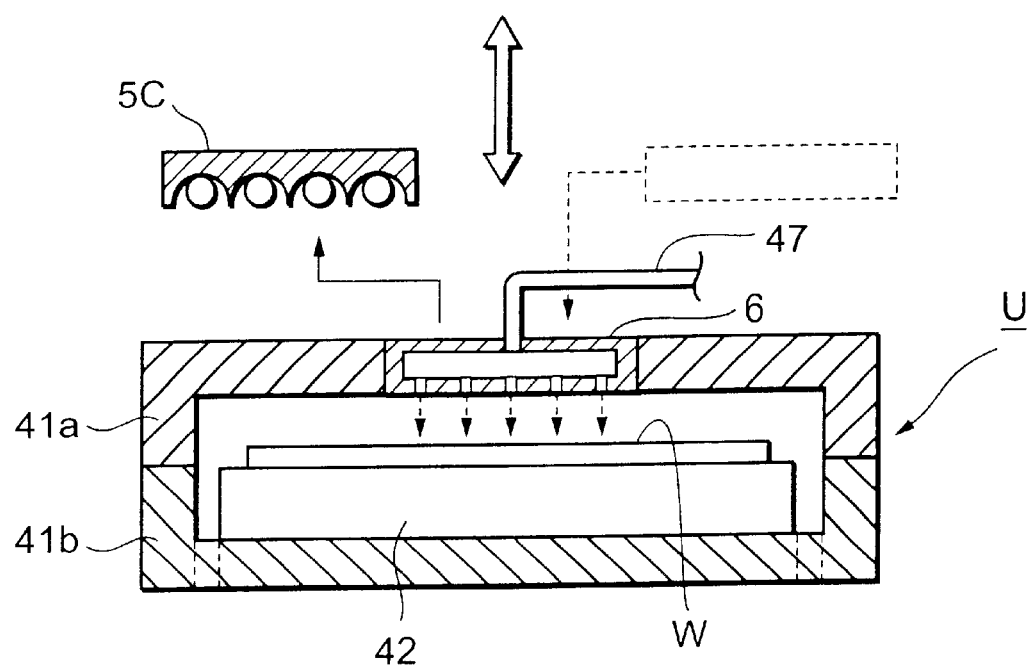

An embodiment shown in FIGS. 12A and 12B is an example, in which a gas supply unit 6 forming the hydrophobic processing gas supply portion and a light source unit 5C are detachably provided at the lid body 41a to be movable between a position where these units are attached to the lid body 41a and a position where they wait after being detached from the lid body 41a by means of a not shown moving mechanism. For example, the gas supply unit 6 is configured the same as for the aforesaid gas supply chamber 61 shown in FIG. 11, and the light source unit 5C is configured the same as for the light source unit 5A shown in FIG. 4, and they are formed in a size attachable to an attachment opening 63 formed in the lid body 41a.

In this embodiment, as shown in FIG. 12A, the light source unit 5C is first attached to the lid body 41a to perform predetermined processing, and then the light source unit 5C is detached and the gas supply unit 6 is attached to perform predetermined hydrophobic processing. In the above-described configuration, the ultraviolet rays and the HMDS gas are supplied to the wafer W respectively from the light source unit 5C and the gas supply unit 6 which are provided almost at the center of the lid body 41a, thereby enhancing the uniformity in the cleaning processing and the hydrophobic processing.

Figure 13:
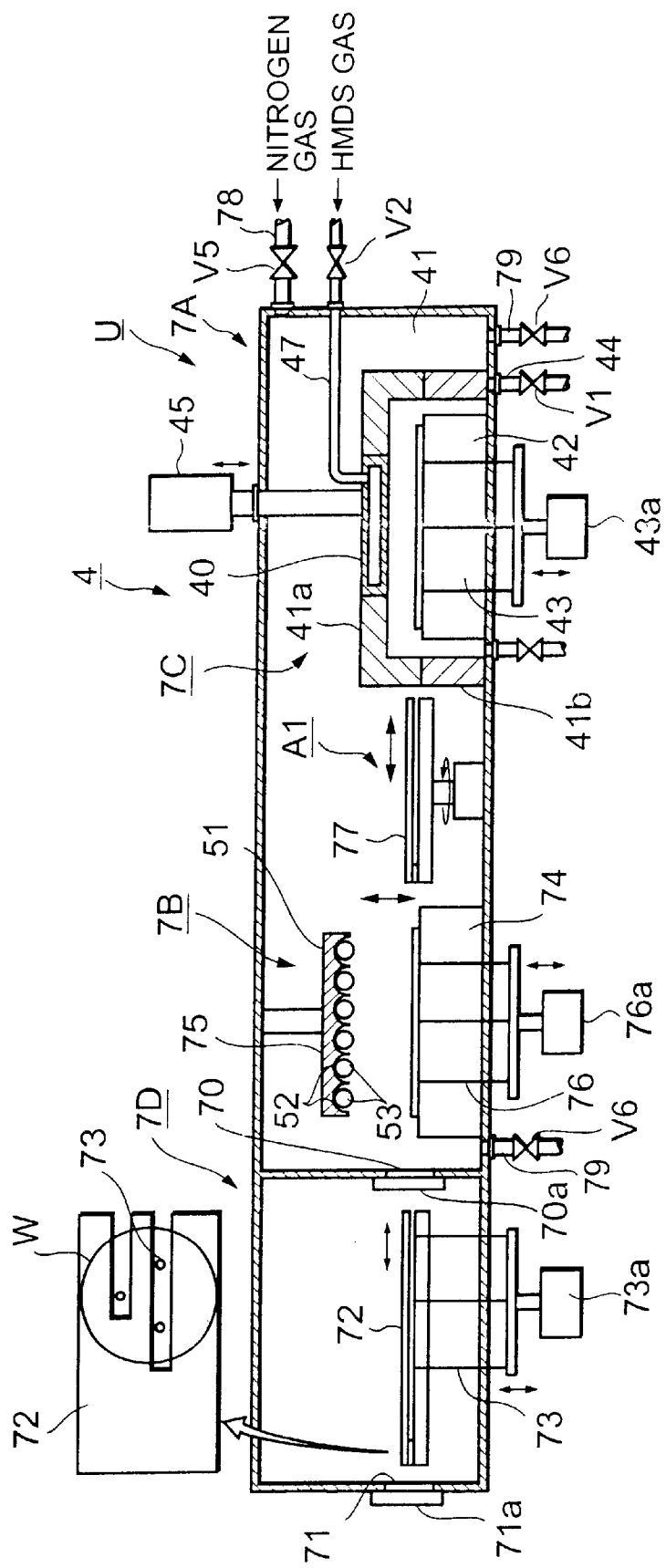
FIG. 13 is a sectional view showing still another embodiment of the cleaning and hydrophobing unit.

Subsequently, another embodiment of the present invention will be explained with reference to FIG. 13. In this embodiment, a cleaning unit 7B for performing cleaning processing and a hydrophobing unit 7C for performing hydrophobic processing are separately provided in a cover body 7A, and an exclusive transport arm A1 transfers the wafer W between the above units.

For example, the cover body 7A is provided with a load lock chamber 7D on the side facing a substrate transporter MA, and the cleaning unit 7B and the hydrophobing unit 7C are provided on the front side and on the back side respectively, as seen from the load lock chamber 7D side, and the transport arm A1 is provided between them in the cover body 7A.

In the drawing, numeral 70 denotes a wafer transport opening of the cover body 7A, numeral 71 a wafer transport opening of the load lock chamber 7D, and numerals 70a and 71a are respective shutters. In the load lock chamber 7D, provided is a transport plate 72 which is configured to be movable back and forth for transferring the wafer W between the substrate transporter MA and the cleaning unit 7B.

The transport plate 72, as shown in a plan view in the drawing, is formed like a comb having, for example, three teeth, so that, for example, three ascending and descending pins 73, which are raised and lowered by a raising and lowering mechanism 73a composed of, for example, a cylinder, protrude between the teeth in such a manner not to interfere the teeth to transfer the wafer W to the plate 72 by combined operations with the substrate transporter MA.

The aforesaid cleaning unit 7B includes a mounting table 74 forming a mounting portion for the wafer W and a light source unit 75 provided to face the mounting table 74. The mounting table 74 includes, for example, three ascending and descending pins 76 which are raised and lowered by a raising and lowering mechanism 76a, for transferring the wafer W to/from the mounting table 74, and the ascending and descending pins 76 are provided at positions where they do not interfere the teeth of the transport plate 72 when the transport plate 72 enters the cleaning unit 7B to transfer the wafer W thereto. The light source unit 75 is configured, for example, the same as in the aforesaid embodiment (the same numerals and symbols are given to the same members). In this embodiment, the distance L between the light source 75 and the wafer W on the mounting table 74 is previously set to a predetermined value, but the light source unit 75 may be provided to ascend and descend freely by means of a not shown raising and lowering mechanism to change the distance L.

The hydrophobing unit 7C has the same configuration as that of the cleaning and hydrophobing unit U shown in FIG. 4 other than that a gas supply unit 40 forming a hydrophobic processing gas supply portion connected to a not shown gas supply source through a gas supply pipe 47 composed of a flexible pipe is provided almost at the center of a lid body 41a, and thus the same numerals and symbols are given to the same members. The gas supply unit 40 is configured in the same manner as the aforesaid gas supply chamber 61 in FIG. 11.

The transport arm A1 includes one arm 77 for holding the wafer W and is configured to be movable back and forth, ascendable and descendable, and rotatable around the vertical axis to transfer the wafer W between the cleaning unit 7B and the hydrophobing unit 7C. A gas supply pipe 78 including a valve V5 for supplying gas, for example, nitrogen gas, which does not absorb the irradiated light, into the cover body 7A, and exhaust pipes 79 including valves V6 are connected to the cover body 7A.

In the cleaning and hydrophobing unit, the ascending and descending pins 73 first wait for the wafer W to be carried into the load lock chamber 7D with protruding from the transport plate 72, and then the shutter 71a is opened for the wafer W to be transferred onto the ascending and descending pins 73, and thereafter the shutter 71a is closed and the ascending and descending pins 73 are lowered to thereby mount the wafer W on the transport plate 72. Then, the shutter 70a is opened to allow the transport plate 72 to enter the cover body 7A side, and, after the completion of movement of the plate 72, the ascending and descending pins 76 of the cleaning unit 7B are protruded and the wafer W is transferred thereto. Thereafter, the transport plate 72 is retracted to the load lock chamber 7D side, and then the shutter 70a is closed. On the other hand, the valves V5 and V6 are opened in the cover body 7A to exchange the inside the cover body 7A for a nitrogen atmosphere.

Subsequently, in the state in which the inside of the cover body is in a predetermined nitrogen concentration, the UV lamps 53 are turned on to perform predetermined cleaning processing, the lid body 41a of the hydrophobing unit 7C is then opened for the transport arm A1 to transfer the wafer W onto the mounting table 42 of the hydrophobing unit 7C, and then the lid body 41a is closed. Then, the valves V1 and V2 are opened to supply the HMDS gas to perform predetermined hydrophobic processing.

Thereafter, the introduction of the HMDS gas is stopped and the inside of a closed container 41 is sufficiently exhausted, and then the lid body 41a is opened to carry out the wafer W from the wafer transport opening 71 through the transport arm A1, the mounting table 74 of the cleaning unit 7B, the transport plate 72 of the load lock chamber 7D.

In this embodiment, the same effects as those of the aforesaid embodiments can also be obtained, and further the adjustment of the nitrogen concentration in the cover body 7A can be performed in a short period of time by virtue of the provision of the load lock chamber 7D, resulting in improved throughput. Further, in this embodiment, a wafer transport opening not shown may be provided to transfer the wafer W, for which the hydrophobic processing has been completed, from the hydrophobing unit 7C directly to the substrate transporter MA, and in this case a second load lock chamber may be provided on the transport opening side.

Figure 14:
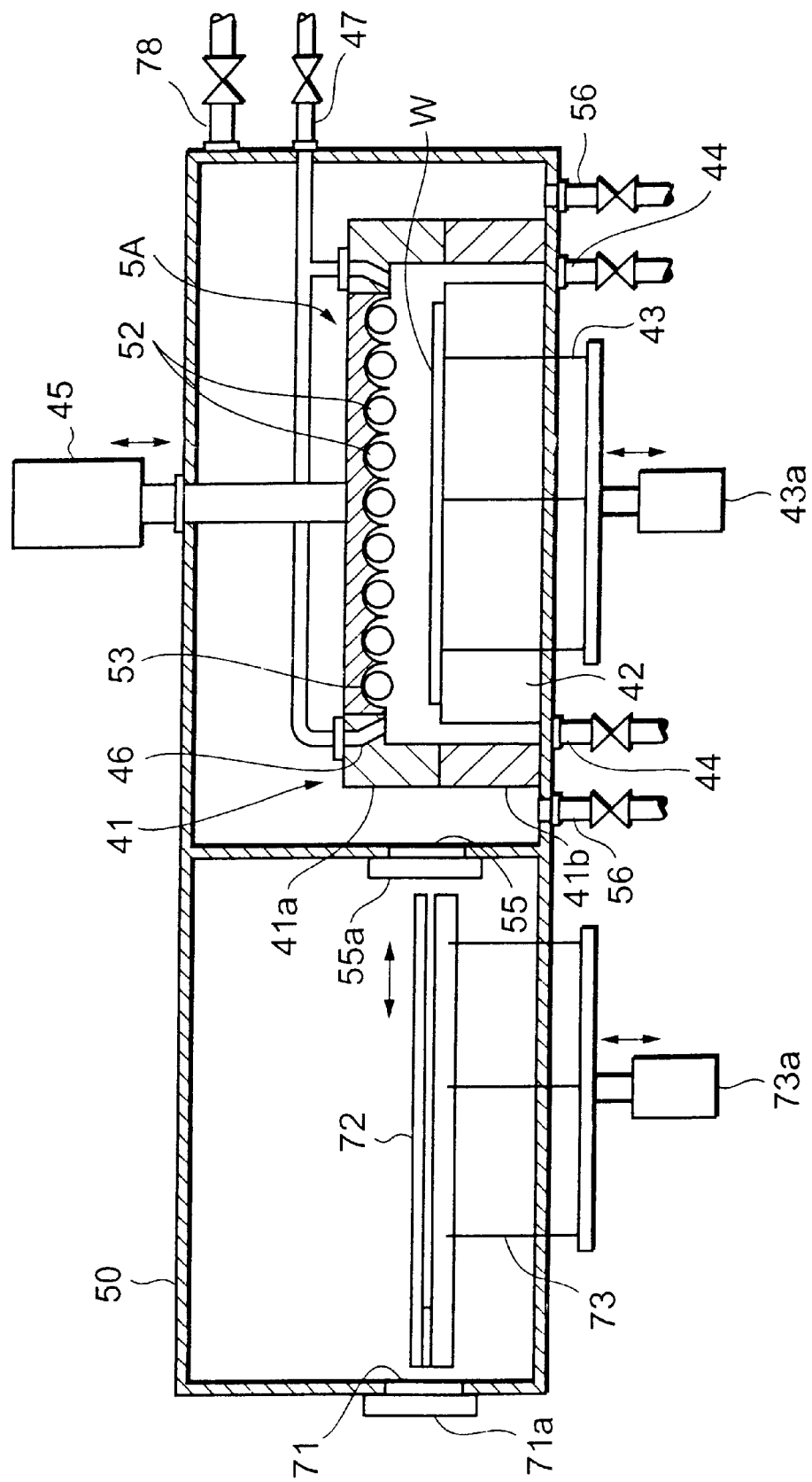
FIG. 14 is a sectional view showing still another embodiment of the cleaning and hydrophobing unit.

In the aforesaid embodiments shown in FIG. 4, FIG. 11, and FIG. 12, a load lock chamber may be provided for each cover body, for example, as shown in FIG. 14. The example shown in FIG. 14 is an example made by combination of the cover body 54 of the unit in FIG. 4 and the load lock chamber 50 of the unit in FIG. 13, and thus the same numerals and symbols are given to the same members.

Figure 15:
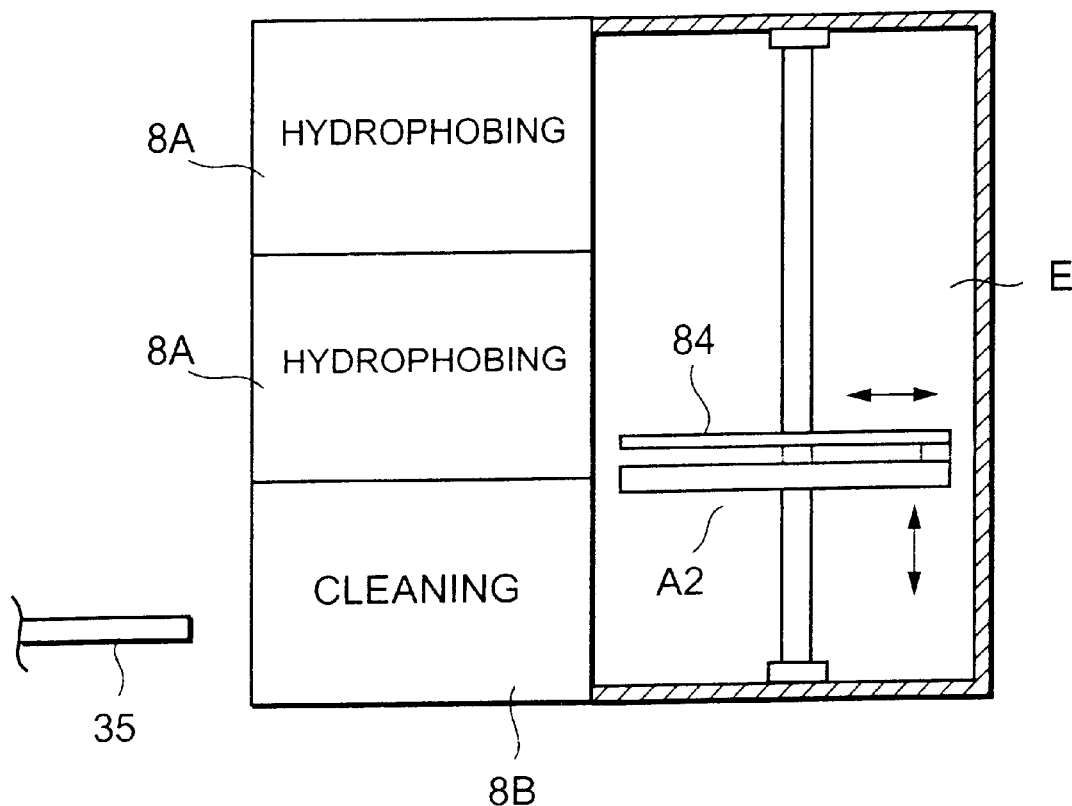
FIG. 15 is a side view showing still another embodiment of the cleaning and hydrophobing unit.
Figure 16:
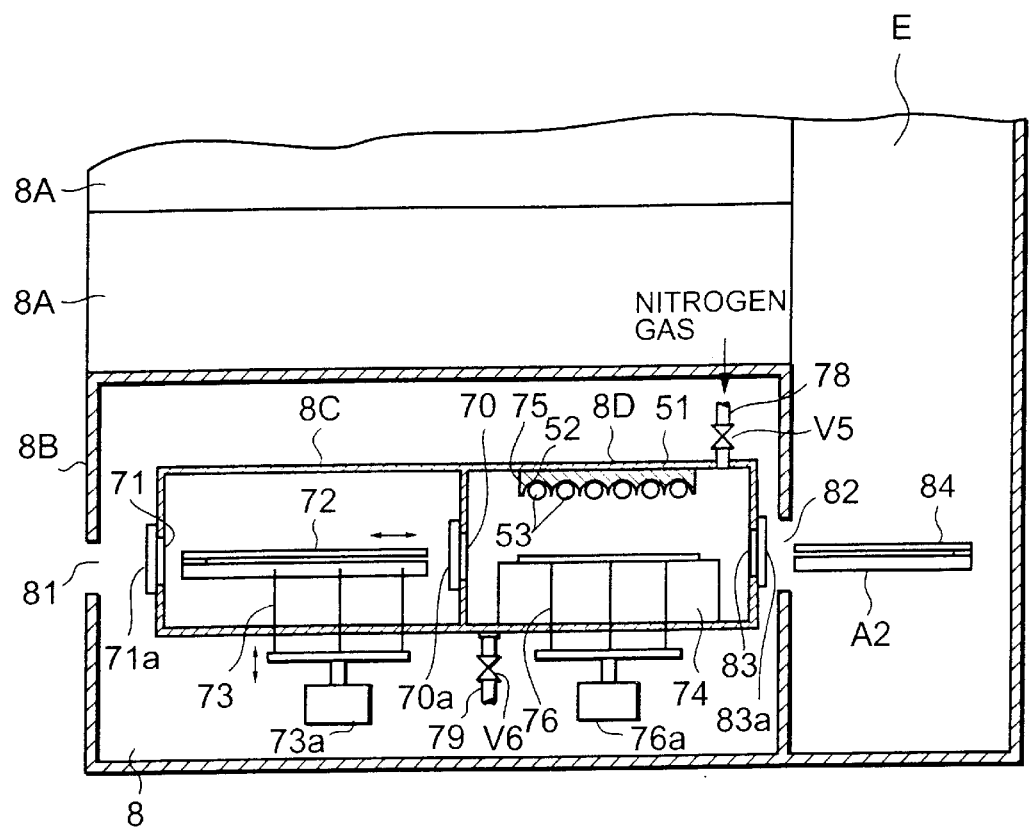
FIG. 16 is a sectional view of the cleaning and hydrophobing unit.
Figure 17:
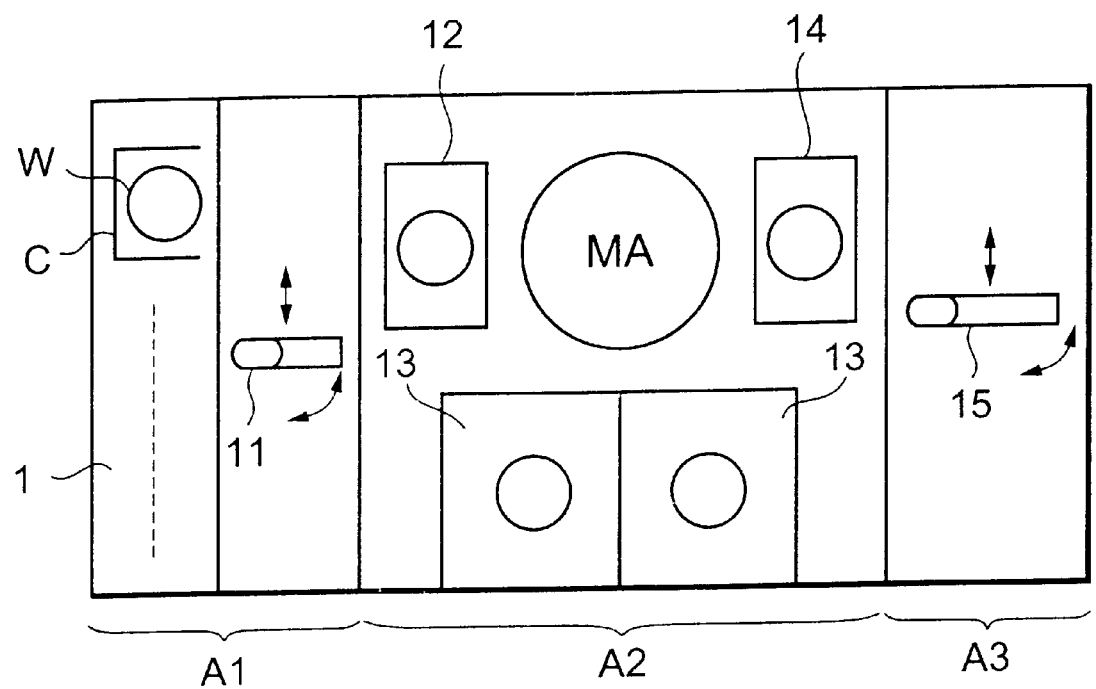
FIG. 17 is a schematic plan view showing a conventional coating and developing apparatus.

Subsequently, another embodiment of the present invention will be explained with reference to FIG. 15 and FIG. 16. In this embodiment, a hydrophobing unit 8A and a cleaning unit 8B are multi-tiered in shelves, and an exclusive transport arm A2 transfers the wafer W between these units through an exclusive transport path E.

In this embodiment, two hydrophobing units 8A and one cleaning unit 8B are multi-tiered with the hydrophobing units 8A at the upper tiers, and the transport path E exclusive for the transport arm A2 is formed on the different side from the side facing the substrate transporter MA of the hydrophobing units 8A and the cleaning unit 8B. For example, the cleaning unit 8B, as shown in FIG. 16, includes a load lock chamber 8C at a position corresponding to the substrate transporter MA, and includes a cleaning chamber 8D on the back side of the load lock chamber 8C, as seen from the substrate transporter MA, and further the transport path E for the transport arm A2 is formed on the back side of the cleaning chamber 8D.

The load lock chamber 8C and the cleaning chamber 8D are provided in a shelf 8 formed with wafer transport openings 81 and 82 at positions corresponding to the substrate transporter MA and to the transport arm A2 respectively, and a wafer transport opening 83 including a shutter 83a is formed on the side facing the transport path E for the transport arm A2 of the cleaning chamber 8D. The rest of the configuration is the same as that of the aforesaid embodiment shown in FIG. 13 other than for the absence of, for example, the hydrophobing unit, and thus the same numerals and symbols are given to the same members.

Each of the two hydrophobing units 8A is also provided in a shelf 8 formed with wafer transport openings (not shown) at positions corresponding to a position facing the substrate transporter MA and to a position corresponding to the transport arm A2 respectively, and the rest of the configuration is the same as that of the aforesaid embodiment shown in FIG, 13 other than for the absence of, for example, the cleaning unit. The transport arm A2 includes one arm 84 for holding the wafer W which is configured to be movable back and forth and to be ascendable and descendable to transfer the wafer W between the cleaning unit 8B and the hydrophobing units 8A.

In the above-described cleaning and hydrophobing unit U, the wafer W is transported to the cleaning chamber 8D through the load lock chamber 8C to perform predetermined cleaning processing under a predetermined nitrogen atmosphere. Thereafter, the wafer W is transferred to the transport arm A2 through the wafer transport opening 83, and after the shutter 83a is closed, the transport arm A2 transports the wafer W to the hydrophobing unit 8A through the exclusive transport path E. After the predetermined processing is completed in the hydrophobing unit 8A, the wafer W is transferred to the substrate transporter MA through the wafer transport opening of the shelf 8 to be transported to the next step.

In this embodiment here, the hydrophobing units 8A and the cleaning unit 8B may be provided at any of the shelf units R1 to R3, or a shelf unit R including the hydrophobing units A and the cleaning unit 8B may be separately provided. Further, the numbers of the hydrophobing units 8A and the cleaning units 8B are not limited to that of the above-described example, and further nitrogen gas may be supplied to the exclusive transport path E to bring its transport space to a nitrogen atmosphere.

In the embodiment as described above, the effects of organic substance removal by irradiation with the ultraviolet rays and improvement in the cleaning efficiency by virtue of the introduction of the nitrogen gas can be obtained as in the aforesaid embodiments, and the plurality of hydrophobing units 8A and the cleaning unit 8B are multi-tiered and the common transport arm A2 transports the wafer W between them, thereby downsizing the apparatus. Further, the wafer is less susceptible to re-contamination during the transport because of existence of the exclusive transport path E. Furthermore, the wafer transport opening corresponding to the substrate transporter MA and the wafer transport opening corresponding to the transport arm A2 are separately provided in the shelf 8 in this embodiment, and thus the transport between them can be smoothly performed, resulting in improved throughput.

Figure 18:
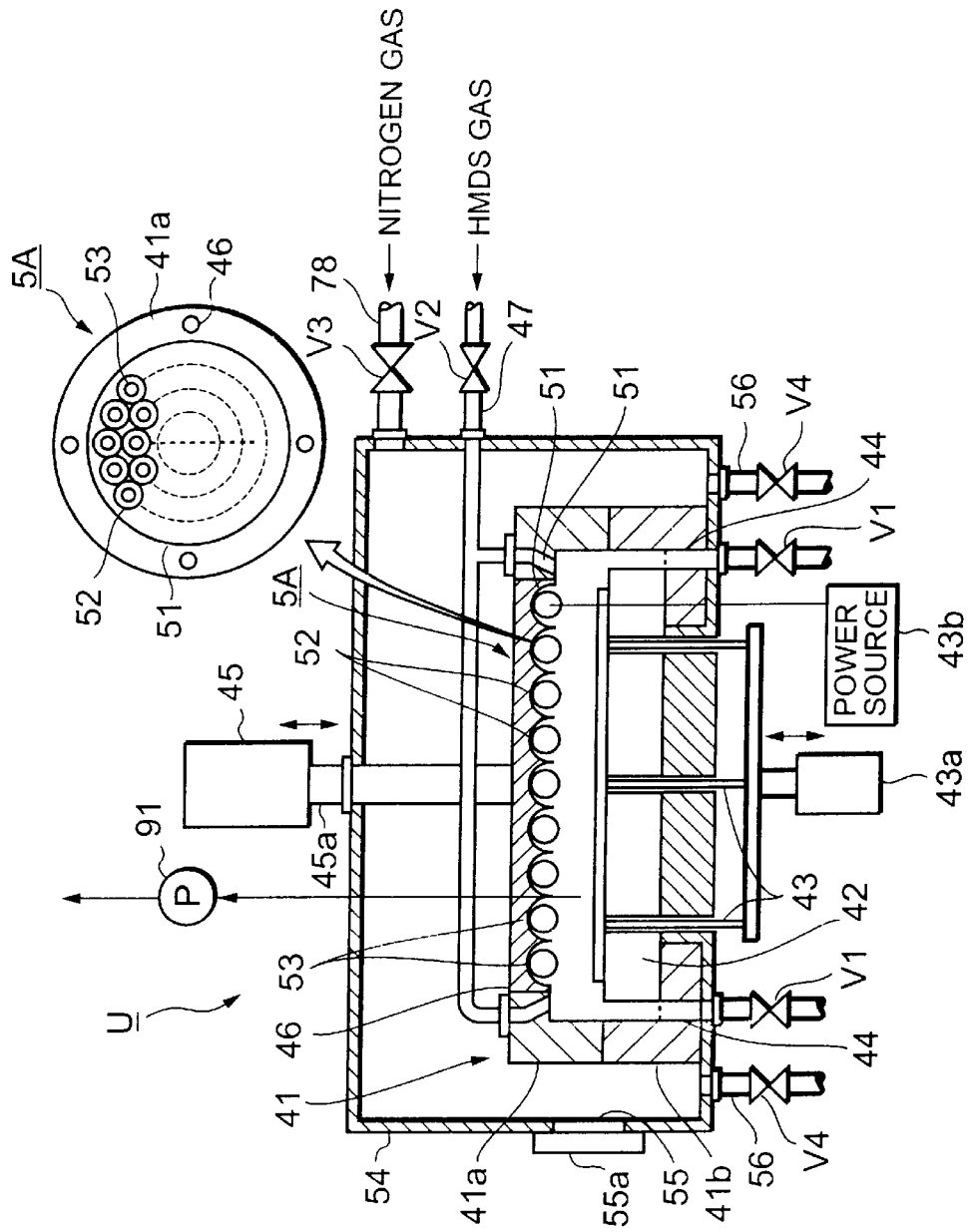
FIG. 18 is a sectional view showing still another embodiment of the cleaning and hydrophobing unit.

Moreover, as shown in FIG. 18, the cleaning and hydrophobing unit U may be equipped with a vacuum pump 91 for reducing a pressure in the unit. In this case, for example, after the UV processing, the vacuum pump 91 preferably reduces the pressure in the unit to about $10^{-4}$ torr to perform the hydrophobic processing. The hydrophobing processing is performed under a reduced pressure, whereby a partial pressure of the hydrophobic processing gas rises, facilitating attachment of the gas to the wafer W, resulting in enhanced interfacial angle of contact. Incidentally, it is more preferable that the pressure inside the unit is first reduced and then the hydrophobic processing gas is introduced into the unit in the above-described processing. This can eliminate waste of the hydrophobic processing gas.

In the present invention in the above, an anti-reflection coating may be formed, in place of the hydrophobic processing, on the front face of the wafer W prior to the coating with the resist. The anti-reflection coating is formed to prevent reflection from occurring on the lower side of a resist during the exposure when a chemically amplified resist is used. Moreover, in the present invention, the substrate is not limited to the wafer but it may be a glass substrate for a liquid crystal display.

According to the present invention, the front face of the substrate is irradiated with light, thereby removing deposits such as organic substances adhering to the substrate to thereby improve the quality of the substrate and perform the cleaning of the substrate uniformly, resulting in enhanced coating properties of the resist solution. In this event, the gas which does not absorb light is introduced into a light irradiation space between the light source and the substrate, thereby improving irradiation efficiency of the light, shortening the period of cleaning time, and further preventing oxidation of the substrate.

The disclosure of Japanese Patent Application No. 2000-63192 filed Mar. 8, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus, comprising:
   a processing chamber;
   a mounting table provided in the processing chamber for mounting theron a substrate;

a light source for irradiating the substrate mounted on the mounting table with a light;

a gas supplier for introducing a gas absorbing no light into the processing chamber; and a hydrophobing unit for supplying a hydrophobic processing gas into the processing chamber;

wherein the light source and the hydrophobing unit are configured to be movable above the mounting table.

2. An apparatus as set forth in claim 1, further comprising:

a load lock chamber disposed adjacent to the processing chamber.

3. An apparatus as set forth in claim 1, wherein the light source irradiates an ultraviolet ray.

4. An apparatus as set forth in claim 3, wherein the light source and the hydrophobic processing gas supplier are provided integrally with the lid body.

5. An apparatus as set forth in claim 1, wherein the gas supplier supplies an inert gas.

6. An apparatus as set forth in claim 1, further comprising:

a pressure reducing mechanism for reducing a pressure in the processing chamber.

7. An apparatus as set forth in claim 1, wherein the gas absorbing no light comprises an inert gas.

* * * * *